(12) United States Patent
Matsui et al.

(10) Patent No.: US 9,915,961 B2
(45) Date of Patent: Mar. 13, 2018

(54) SEMICONDUCTOR DEVICE DRIVE METHOD

(71) Applicant: FUJI ELECTRIC CO., LTD., Kawasaki (JP)

(72) Inventors: Toshiyuki Matsui, Matsumoto (JP); Hitoshi Abe, Matsumoto (JP); Noriaki Yao, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/845,885

(22) Filed: Sep. 4, 2015

(65) Prior Publication Data

US 2015/0378376 A1    Dec. 31, 2015

Related U.S. Application Data

(63) Continuation of application No. PCT/JP2014/056809, filed on Mar. 13, 2014.

(30) Foreign Application Priority Data

Apr. 5, 2013    (JP) .................................. 2013-079449

(51) Int. Cl.
*G01K 1/08* (2006.01)
*G05F 1/46* (2006.01)
(Continued)

(52) U.S. Cl.
CPC ............... *G05F 1/463* (2013.01); *G01K 7/01* (2013.01); *H01L 27/0255* (2013.01);
(Continued)

(58) Field of Classification Search
CPC combination set(s) only.
See application file for complete search history.

(56) References Cited

U.S. PATENT DOCUMENTS 4,760,434 A * 7/1988 Tsuzuki .................. H01L 23/34
257/328
2005/0111507 A1* 5/2005 Ueki ................... H01S 5/18377
372/46.01
(Continued)

FOREIGN PATENT DOCUMENTS

JP    62-229866    10/1987
JP    2001-332694    11/2001
(Continued)

OTHER PUBLICATIONS (2000). The Authoritative Dictionary of IEEE Standards Terms, Standards Information Network IEEE Press, 7th Edition, pp. 266 and 736.*

(Continued)

*Primary Examiner* — Lisa Caputo
*Assistant Examiner* — Janice M Soto

(57) ABSTRACT

A semiconductor device drive method achieves a balance between a lifetime and a detection sensitivity which are required for a temperature detection diode formed via an insulating film on a substrate on which an active element is formed. The semiconductor device drive method includes energizing the temperature detection diode with a constant current, the constant current having a current density value between an upper limit defined based on the lifetime of the temperature detection diode, and a lower defined based on a variation allowable voltage of an output voltage of the temperature detection diode with respect to a standard deviation.

5 Claims, 5 Drawing Sheets

(51) Int. Cl.
  *H01L 27/02* (2006.01)
  *G01K 7/01* (2006.01)
  *H01L 29/04* (2006.01)
  *H01L 29/16* (2006.01)
  *H01L 29/861* (2006.01)

(52) U.S. Cl.
  CPC .............. *H01L 29/04* (2013.01); *H01L 29/16* (2013.01); *H01L 29/861* (2013.01)

(56) References Cited

U.S. PATENT DOCUMENTS

| | | | | |
|---|---|---|---|---|
| 2005/0232333 A1* | 10/2005 | Franch | ..................... | G01K 7/01 374/178 |
| 2007/0090348 A1* | 4/2007 | McCreery | .............. | B82Y 10/00 257/40 |
| 2007/0158776 A1* | 7/2007 | Julio | ........................ | G01K 7/01 257/486 |
| 2013/0301680 A1* | 11/2013 | Qiu | .......................... | G01K 7/01 374/184 |

FOREIGN PATENT DOCUMENTS

| | | |
|---|---|---|
| JP | 2010-199490 | 9/2010 |
| WO | WO 2012/175603 | * 12/2012 |

OTHER PUBLICATIONS

Sedra, Adel S. and Kenneth C. Smith. Microelectronic Circuits, Oxford University Press, 2004, Fith Edition, pp. 148-150.*
"What is Bias Voltage?" (2014) Retrieved from http://www.learningaboutelectronics.com/Articles/What-is-bias-voltage.*
International Search Report dated Jun. 3, 2014, in corresponding International Application No. PCT/JP2014/056809.

* cited by examiner

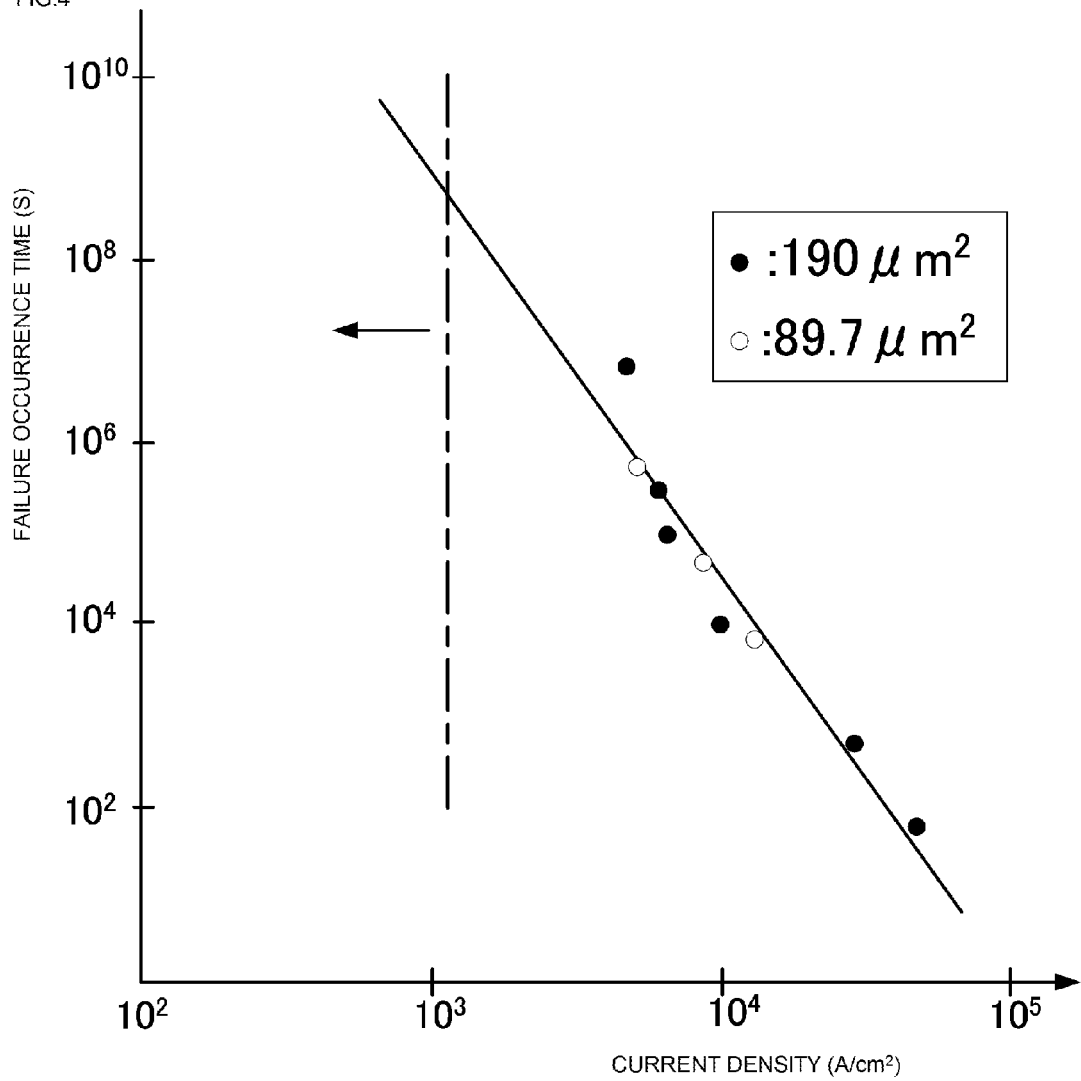

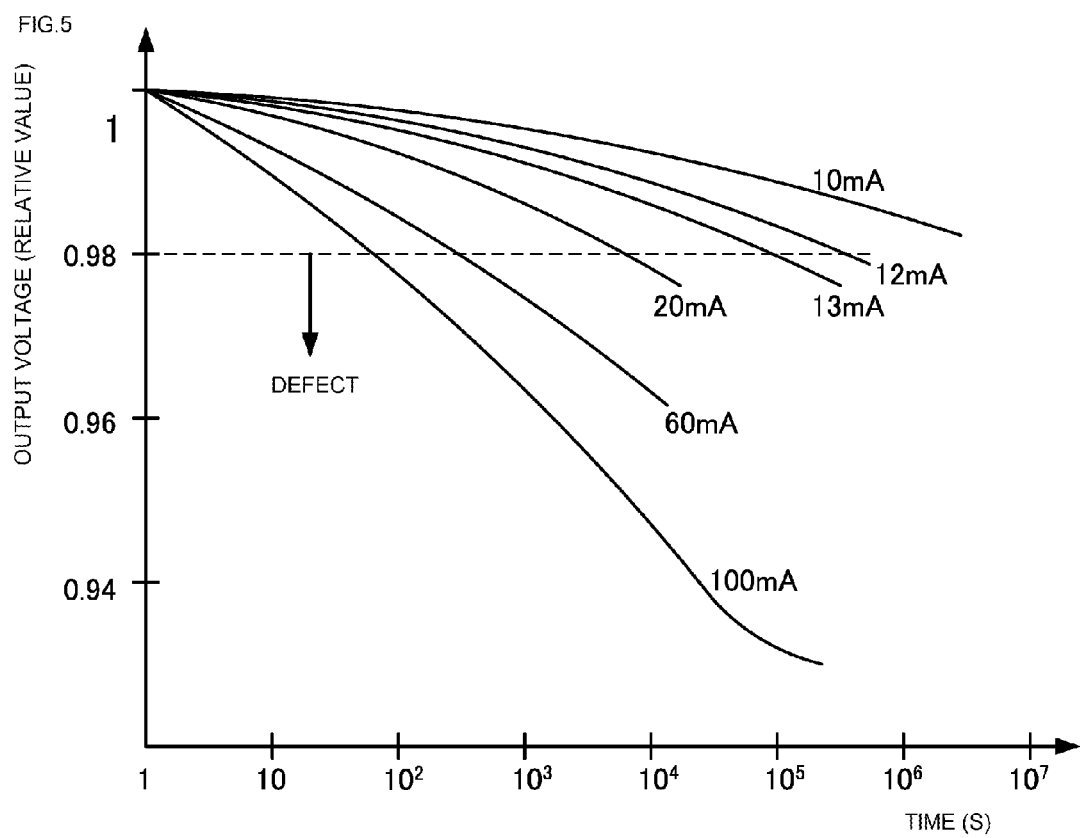

SEMICONDUCTOR DEVICE DRIVE METHOD

CROSS-REFERENCE TO RELATED APPLICATIONS

This application is a continuation application, filed under 35 U.S.C. § 111(a), of International Application PCT/JP2014/056809 filed on Mar. 13, 2014, and claims benefit of foreign priority to Japanese Patent Application 2013-079449 filed Apr. 5, 2013, the disclosure of each of which is incorporated herein by reference.

BACKGROUND

1. Field

The present disclosure relates to a semiconductor device drive method whereby it is possible to achieve a balance between a performance and a lifetime which are required for a temperature detection diode formed via an insulating film on a substrate on which an active element is formed.

2. Related Art

In a semiconductor device including a semiconductor active element such as a metal-oxide-semiconductor field-effect transistor (MOS-FET) or an insulated-gate bipolar transistor (IGBT), it is often the case that a temperature detection element is formed via an insulating film on a substrate on which the semiconductor active element is formed, that is, on an active element substrate. The temperature detection element, being generally formed of a temperature detection diode realized as a pn junction diode formed from polycrystalline silicon, is configured by connecting one or a plurality of the temperature detection diodes in series. The temperature detection diode is energized and driven with a constant current exclusively when the semiconductor active element operates. Further, the operation temperature of the semiconductor active element is monitored from a voltage Vf generated in the temperature detection diode (for example, refer to patent application publication JP-A-62-229866).

SUMMARY

Meanwhile, many crystal defects exist in the polycrystalline silicon. Moreover, the crystal defects of the polycrystalline silicon increase in the recombination process in polycrystal associated with an energization of the temperature detection element. The speed of generation of the crystal defects is proportional exclusively to the energizing current of the temperature detection diode. Hence, the output voltage Vf of the temperature detection diode changes gradually by continuing to energize the temperature detection diode with a constant current.

Aging variation in this kind of output characteristics (the output voltage Vf) of the temperature detection diode is proportional to the energizing current of the temperature detection diode, and the larger the energizing current, the greater a fluctuation in the output voltage Vf, as shown in FIG. 5. In other words, when the point at which the fluctuation amount of the output voltage Vf exceeds, for example, 2% is defined to be the end of the lifetime of the temperature detection diode, the larger the energizing current, the shorter the lifetime, as shown in FIG. 5. Consequently, in order to lengthen the lifetime of the temperature detection diode, it is necessary to reduce the energizing current of the temperature detection diode.

However, when the energizing current of the temperature detection element is reduced to avoid a substantial aging variation of the temperature detection diode, the element characteristics of the temperature detection diode deteriorate adversely. Then, variation in the output voltage Vf of the temperature detection diode increases, thus raising the problem that the temperature detection sensitivity decreases. Hence, there is the problem that it is difficult to optimally set an energizing current in reducing the aging variation of the temperature detection diode and thus increasing the lifetime thereof, and at the same time, sufficiently securing the detection sensitivity of the temperature detection diode, based on the kind of output characteristics of the temperature detection diode shown in FIG. 5.

An aspect of the invention, embodiments of which have been contrived bearing in mind these kinds of circumstances, is to provide a semiconductor device drive method whereby, in a semiconductor device including a temperature detection diode formed via an insulating film on a substrate on which an active element is formed, it is possible to achieve a balance between a lifetime and a detection sensitivity which are required for the temperature detection diode.

In order to achieve the heretofore described aspect, a semiconductor device drive method according to an embodiment of the invention is a drive method of a semiconductor device including a temperature detection diode, formed from, for example, polycrystalline silicon, which has a pn junction formed via an insulating film on a substrate on which a semiconductor active element is formed, wherein when detecting a voltage generated in the temperature detection diode by energizing the temperature detection diode with a constant current, the upper limit of a current density energizing the temperature detection diode is defined based on the lifetime of the temperature detection diode, and the lower limit of the current density energizing the temperature detection diode is defined based on a variation allowable voltage of an output voltage of the temperature detection diode with respect to a standard deviation. Further, the method is characterized in that a current value energizing the temperature detection diode is determined in a range between the upper limit and the lower limit.

That is, the semiconductor device drive method focuses attention on the fact that when a current energizing the temperature detection diode is taken as a current density of the temperature detection diode, lifetime characteristics, which are elapsed time characteristics up until a failure occurrence in the temperature detection diode, depend on the current density regardless of the pn junction area of the temperature detection diode, specifically, a pn junction diode. Also, at the same time, the method focuses attention on the fact that a standard deviation indicative of variation in the output voltage indicating a temperature detection sensitivity of the temperature detection diode depends on the current density.

Incidentally, the upper limit of the current density is set as 1213 $A/cm^2$ when the lifetime required for the temperature detection diode is, for example, 15 years. Also, the lower limit of the current density is set as 50 $A/cm^2$ when the variation allowable voltage of the output voltage of the temperature detection diode with respect to the standard deviation is, for example, 2.5 mV.

According to the semiconductor device drive method whereby the energizing current of the temperature detection diode is defined under the heretofore described conditions, it is possible to satisfy the lifetime required for the temperature detection diode while satisfying the output characteristics, in particular, the temperature detection sensitivity, required for the temperature detection diode. Consequently, it is possible to achieve a balance between a required lifetime and temperature detection sensitivity by determining the energizing current of the temperature detection diode, in response to the size, that is, the pn junction area of the temperature detection diode, at the current density. Therefore, the practical advantages of the semiconductor device method are enormous.

BRIEF DESCRIPTION OF DRAWINGS

These and/or other aspects and advantages will become apparent and more readily appreciated from the following description of the embodiments, taken in conjunction with the accompanying drawings of which:

FIG. 4 is a chart showing the relationship of an elapsed time until a failure occurrence with the current density energizing the temperature detection diode.

FIG. 5 is a chart showing an aging variation of output characteristics of a temperature detection diode when a current energizing the temperature detection diode is set as a parameter.

DESCRIPTION OF EMBODIMENTS

Hereafter, a description will be given, with reference to the drawings, of a semiconductor device drive method according to one embodiment of the invention.

Figure 1:
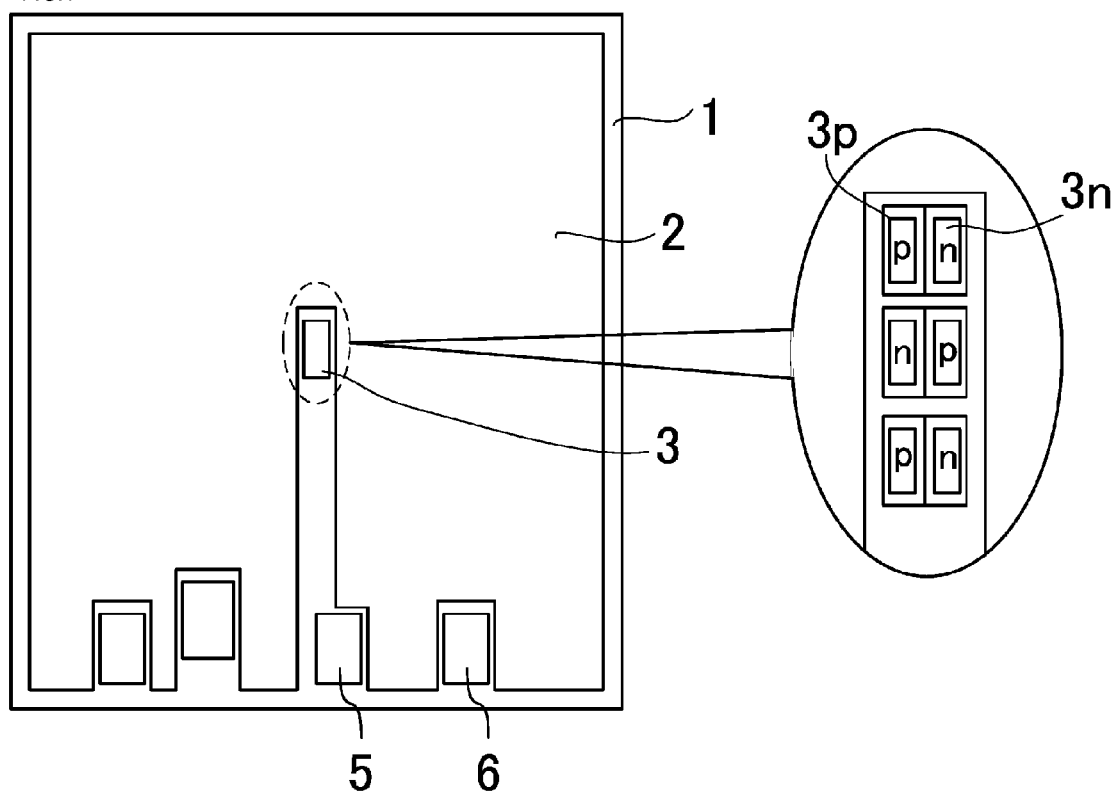
FIG. 1 is a schematic configuration diagram in plan showing one example of a semiconductor device to which the a drive method according to an embodiment of the invention may be applied.

FIG. 1 is a schematic configuration diagram in plan showing one example of a semiconductor device to which the drive method is applied.

Figure 2:
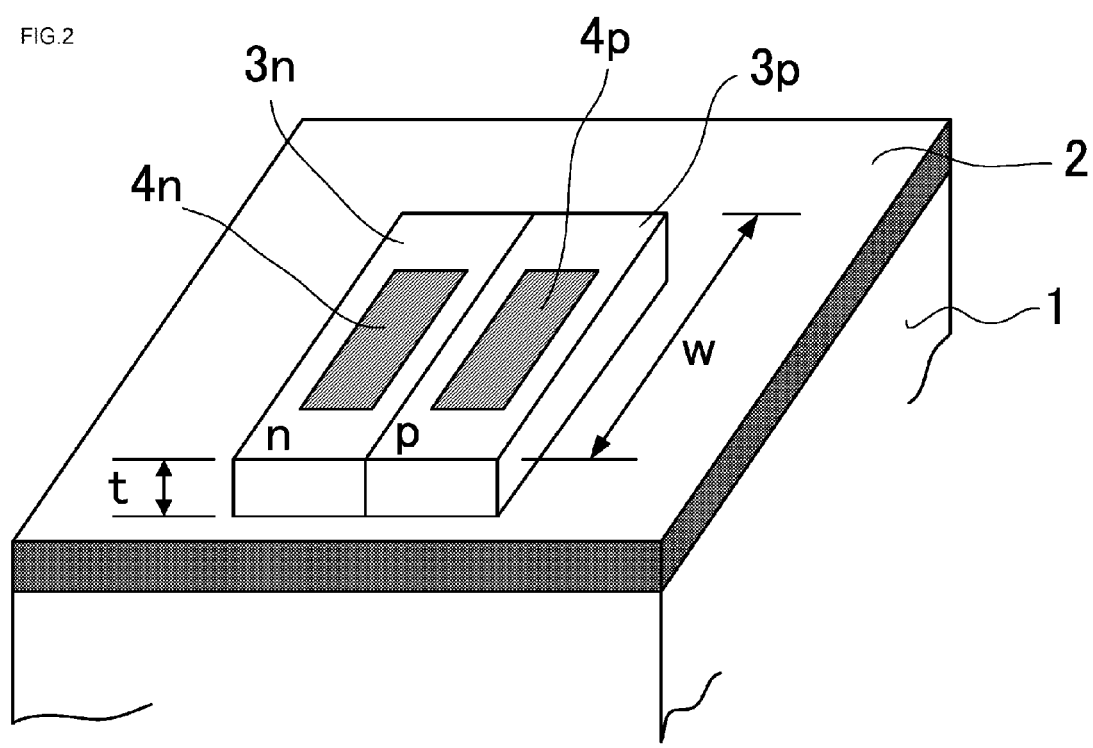
FIG. 2 is a diagram showing an example of a temperature detection diode included in the semiconductor device shown in FIG. 1.

The semiconductor device includes a temperature detection element, specifically, a temperature detection diode 3, which has a pn junction formed via an insulating film 2 on a substrate 1 on which is formed a semiconductor active element, such as a MOS-FET or an IGBT. Incidentally, the temperature detection diode 3 is such that a p-type region $3p$, wherein boron (B) ions are implanted into polycrystalline silicon, and an n-type region $3n$, wherein phosphorus (P) ions are implanted, are provided in substantially the central portion of the substrate 1, and that a pn junction is formed between the regions $3p$ and $3n$, for example, as shown in FIG. 2. A pn junction area which is the size of the pn junction is, for example, 380 μm×0.5 μm=190 μm$^2$.

In FIGS. 2, $4p$ and $4n$ are the electrode of the p-type region $3p$ and the electrode of the n-type region $3n$, respectively. Also, FIG. 1 shows an example wherein three temperature detection diodes 3 are formed, as the temperature detection element, in substantially the central portion of the substrate 1, and the three temperature detection diodes 3 are connected in series. The series connection of the temperature detection diodes 3 is carried out by connecting the electrodes $4p$ and $4n$ in order using a conductor (not shown) of gold (Au) or the like. Also, in the drawing, there is an anode terminal 5 of the temperature detection element formed of the temperature detection diodes 3 connected in series, and a cathode terminal 6 of the temperature detection element.

Figure 3:
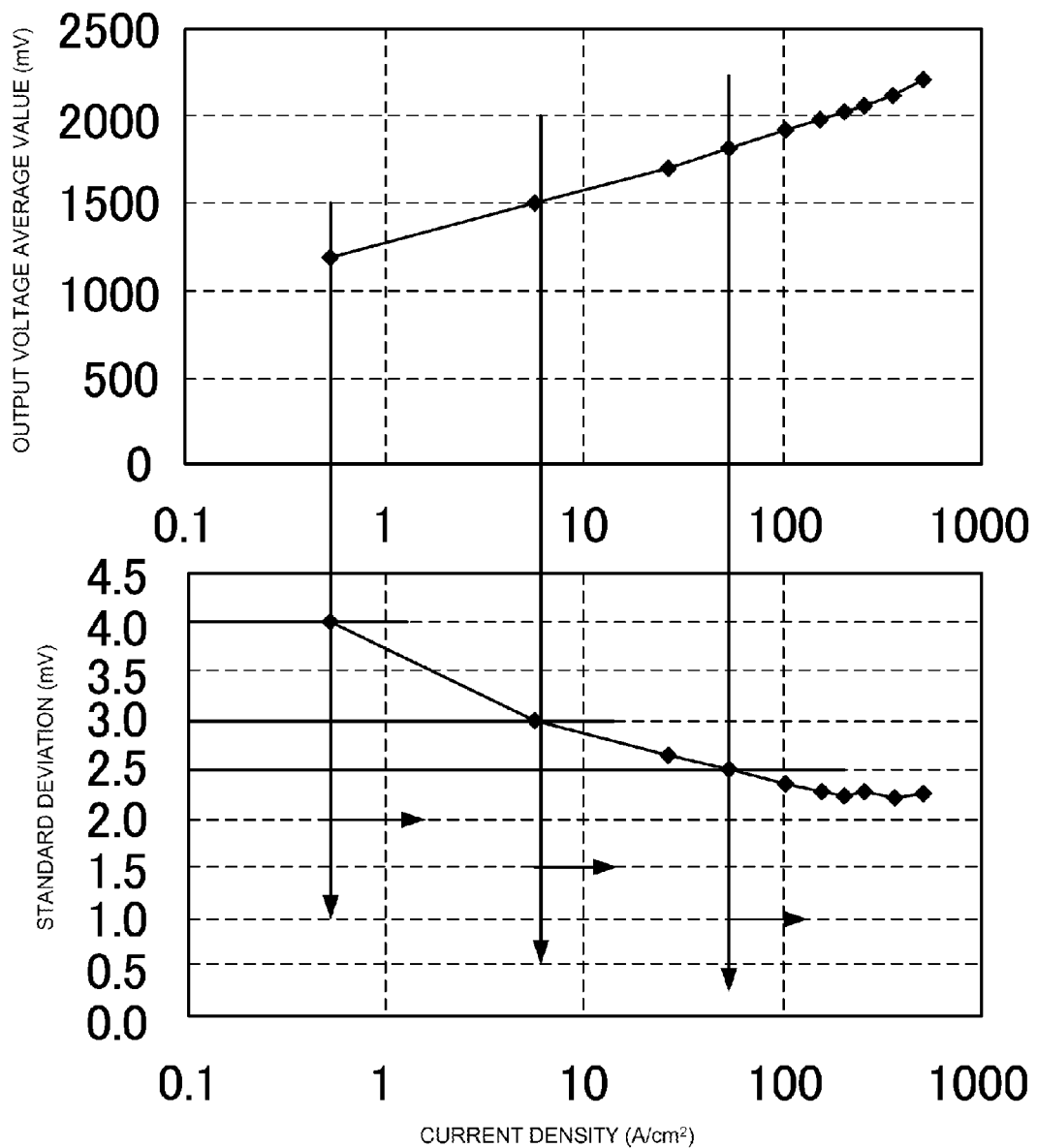
FIG. 3 is a chart showing the relationship of an average value of, and a standard deviation of variation in, an output voltage with a current density energizing the temperature detection diode.

Herein, the characteristics shown below are found after studying the output characteristics of the temperature detection diodes 3 formed in the way heretofore described. FIG. 3 shows a change in an output voltage Vf when 30 IGBT chips (semiconductor devices), each of which includes a temperature detection element wherein three temperature detection diodes 3 are connected in series, are prepared, and a current value energizing the temperature detection diodes 3 is changed. In particular, in FIG. 3, the current value energizing the temperature detection diodes 3 is normalized as a value wherein a current density flowing through the pn junction, that is, the energizing current value is divided by the pn junction area. Further, FIG. 3 shows the normalization as the relationship of the average value and standard deviation of the output voltage Vf with the current density.

The standard deviation denotes the degree (size) of variation in the output voltage Vf. Incidentally, in order to satisfy a required temperature detection sensitivity, it is necessary that the variation in the output voltage Vf is equal to or higher than an output voltage corresponding to a minimum detection temperature. Consequently, conditions for satisfying the required temperature detection sensitivity are defined as a variation allowable voltage of the output voltage Vf in the temperature detection diodes 3 which is denoted by the standard deviation.

Incidentally, according to the characteristics (experimental data) shown in FIG. 3, it is shown that when the variation allowable voltage of the output voltage Vf in satisfying the required temperature detection sensitivity is a standard deviation of 2.5 mV, the current density only has to be equal to or more than substantially 50 A/cm$^2$. The average value of the output voltage Vf at this time is 1811 mV. Also, it is shown that when the variation allowable voltage is a standard deviation of 3.0 mV, the current density only has to be equal to or more than substantially 5.0 A/cm$^2$. The average value of the output voltage Vf at this time is 1502 mV. Further, it is shown that when the variation allowable voltage is a standard deviation of 4.0 mV, the current density only has to be equal to or more than substantially 0.5 A/cm$^2$. The average value of the output voltage Vf at this time is 1195 mV.

Herein, in the temperature detection diodes 3, the smaller the current value energizing the temperature detection diodes 3, the greater the variation in the output voltage Vf resulting from a crystal defect, as heretofore described. Consequently, the current density energizing the temperature detection diodes 3 is set to at least equal to or more than 50 A/cm$^2$. As a result of this, it is possible to sufficiently fulfill the conditions even when the required temperature detection sensitivity is high and it is thus necessary to suppress the variation allowable voltage to, for example, equal to or less than a standard deviation of 2.5 mV.

Meanwhile, when the lifetime of the temperature detection diodes 3 is defined to expire at the point at which under certain temperature conditions, the output voltage Vf of the temperature detection diodes 3 fluctuates by 2% from a voltage value when the energization starts, the lifetime changes with respect to the current density energizing the temperature detection diodes 3, for example, as shown in FIG. 4. FIG. 4 shows a change in the respective lifetimes of the temperature detection diode 3 with a pn junction area of 190 μm$^2$ and the temperature detection diode 3 with a pn junction area of 89.7 μm$^2$, which have obtained the characteristics shown in FIG. 3, when the ambient temperature of the two temperature detection diodes 3 is maintained at 150° C. Also, the two temperature detection diodes 3, as they are formed from the same polycrystalline silicon, exhibit the same lifetime characteristics even when the pn junction areas of the two temperature detection diodes 3 are different from one another.

Further, according to the lifetime characteristics shown in FIG. 4, it is shown that when the lifetime of the temperature detection diodes 3 is taken to be 10 years ($3.154 \times 10^8$ s), the current density energizing the temperature detection diodes 3 can be set to a maximum of 1331 A/cm². Also, it is shown that when the lifetime of the temperature detection diodes 3 is taken to be 15 years ($4.730 \times 10^8$ s), the current density energizing the temperature detection diodes 3 can be set to a maximum of 1213 A/cm². Furthermore, it is shown that when the lifetime is taken to be 20 years ($6.307 \times 10^8$ s), the current density energizing the temperature detection diodes 3 is set to a maximum of 1136 A/cm².

Incidentally, a lifetime required for this kind of semiconductor device used in, for example, an automobile is generally 15 years. Consequently, when taking this into account, it is conceivable that it is possible to sufficiently satisfy the lifetime requirement by setting the current density energizing the temperature detection diodes 3 to equal to or less than 1213 A/cm². Moreover, it is possible to define a current density which can satisfy the lifetime, in the way heretofore described, regardless of the size of the temperature detection diodes 3, specifically, the pn junction area of the temperature detection diodes 3.

Consequently, a current density Jf which is to energize the temperature detection diodes 3 based on the current density conditions defined in the way heretofore described is determined in a range of 50 A/cm² ≤ Jf ≤ 1213 A/cm², and it is thereby possible to simultaneously satisfy the lifetime and temperature detection sensitivity required for the temperature determination diodes 3. Therefore, the current value which is to energize the temperature detection diodes 3 in response to the size, specifically, the pn junction area of the temperature detection diodes 3 is determined under the conditions for setting the current density Jf, and it is thereby possible to sufficiently secure the lifetime of the temperature detection diodes 3 while satisfying the required temperature detection sensitivity.

The invention is not limited to the heretofore described embodiment. It goes without saying that, for example, the number and size of pn junction diodes configuring the temperature detection diodes 3 only has to be determined taking into account the operation temperature or the like of a semiconductor device such as an IGBT or a MOS-FET. Also, when the lifetimes required for the temperature detection diodes 3 are different from one another, the upper limit of the current density only has to be defined in response to each different lifetime, and in the same way, the lower limit of the current density only have to be defined in response to the temperature detection sensitivity required for the temperature detection diodes 3.

Although an embodiment has been shown and described, it would be appreciated by those skilled in the art that changes may be made in the embodiment without departing from the principles and spirit of the invention, the scope of which is defined in the claims and their equivalents.

REFERENCE SIGNS AND NUMERALS ARE AS FOLLOWS

1 Substrate with semiconductor active element formed thereon
2 Insulating film
3 Temperature detection diode
3p p-type region
3n n-type region
4p, 4n Electrode
5 Anode terminal
6 Cathode terminal

What is claimed is:

1. A method of driving a semiconductor device to perform temperature detection using the semiconductor device, the semiconductor device including a substrate, an insulating film on the substrate and a plurality of temperature detection elements comprising respective temperature detection diodes each having a pn junction formed via the insulating film on the substrate, the method comprising:

determining an allowable value, of a standard deviation of voltages respectively output by the plurality of temperature detection elements, at which the semiconductor device has at least a desired temperature detection sensitivity when the temperature detection is performed;

determining a lower limit and an upper limit of a current density of a constant current to energize the temperature detection diode of one of the plurality of temperature detection elements, the determining comprising:

using a relation between the current density and the standard deviation of the output voltages to determine a first value of the current density that, according to the relation, obtains the allowable value of the standard deviation of the output voltages, the first value being determined as the lower limit, and using a relation between the current density and lifetime of the temperature detection diode to determine a second value of the current density that, according to the relation between the current density and lifetime, obtains a desired value of the lifetime of the temperature detection diode, the second value being determined as the upper limit;

selecting a current value of the constant current such that the current value corresponds to a current density between the upper limit and the lower limit; and energizing the temperature detection diode with the constant current being at the determined current value to generate a voltage in the one of the plurality of temperature detection elements and detecting the voltage generated by the energizing, to thereby perform the temperature detection.

2. The method according to claim 1, wherein
the temperature detection diode is a pn junction diode formed from polycrystalline silicon.

3. The method according to claim 1, wherein
the lifetime desired for the temperature detection diode is 15 years, and
the upper limit of the current density is 1213 A/cm².

4. The method according to claim 1, wherein
the allowable value of the standard deviation of the output voltage is 2.5 mV, and
the lower limit of the current density is 50 A/cm².

5. The method according to claim 1, wherein the relation between the current density and the standard deviation of the output voltages is an inverse correlation between the current density and the standard deviation of the output voltages.

* * * * *